(12) United States Patent
Andideh et al.

(10) Patent No.: US 6,596,646 B2
(45) Date of Patent: Jul. 22, 2003

(54) METHOD FOR MAKING A SUB 100 NANOMETER SEMICONDUCTOR DEVICE USING CONVENTIONAL LITHOGRAPHY STEPS

(75) Inventors: Ebrahim Andideh, Portland, OR (US); Alan M. Myers, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 09/918,622

(22) Filed: Jul. 30, 2001

(65) Prior Publication Data

US 2003/0022517 A1 Jan. 30, 2003

(51) Int. Cl.[7] .............................................. H01L 21/302
(52) U.S. Cl. ........................ 438/723; 438/725; 438/745
(58) Field of Search ................................. 438/706, 710, 438/712, 714, 723, 725, 733, 745, 756

(56) References Cited

U.S. PATENT DOCUMENTS

| | | | | |
|---|---|---|---|---|
| 5,773,199 A | * | 6/1998 | Linliu et al. | 430/316 |
| 5,837,428 A | * | 11/1998 | Huang et al. | 430/313 |
| 6,030,901 A | * | 2/2000 | Hopper et al. | 438/711 |
| 6,399,286 B1 | * | 6/2002 | Liu et al. | 430/316 |
| 6,448,177 B1 | * | 9/2002 | Morrow et al. | 438/638 |
| 6,465,358 B1 | * | 10/2002 | Nashner et al. | 438/700 |

* cited by examiner

Primary Examiner—Kin Chan Chen
(74) Attorney, Agent, or Firm—Mark V. Seeley

(57) ABSTRACT

A method of forming a semiconductor device is described. In that method, a masking layer is formed on a substrate. A layer of photoresist is then deposited and patterned on that layer to expose a first part of the masking layer while covering a second part of the masking layer. After the exposed part of that layer is etched, the resulting device is exposed to a plasma generated from a forming gas. Part of the second part of the masking layer is then removed by exposing the resulting device to a solution, while part of the second part of the masking layer is retained.

14 Claims, 2 Drawing Sheets

METHOD FOR MAKING A SUB 100 NANOMETER SEMICONDUCTOR DEVICE USING CONVENTIONAL LITHOGRAPHY STEPS

FIELD OF THE INVENTION

The present invention relates to a method for making semiconductor devices.

BACKGROUND OF THE INVENTION

The critical dimensions ("CDs") for various types of features that may be formed, when making a semiconductor device, continue to shrink. In this respect, 0.13 micron process technology will soon be used in high volume production, while experimental devices with 20 nanometer CDs have been made. Significant CD reduction from current values faces many obstacles, however. Consider, for example, the current methods for defining a transistor's CD. Those methods generally rely upon a photolithographic process. That process requires a layer of photoresist to be patterned such that it covers only part of an underlying polysilicon layer, enabling exposed portions to be removed. The available DUV lithographic steppers cannot reduce a transistor's CD below certain levels—even when phase shift masks are used, or when part of the previously patterned photoresist is removed prior to the etch step.

Accordingly, there is a need for a process for making a semiconductor device that facilitates significant reduction in the CD of features that may be formed on such a device. There is a need for such a process that enables creation of transistors with CDs that are much smaller than those that conventional photolithographic processes can generate. The method of the present invention provides such a process.

DETAILED DESCRIPTION OF THE PRESENT INVENTION

Figure 1A:
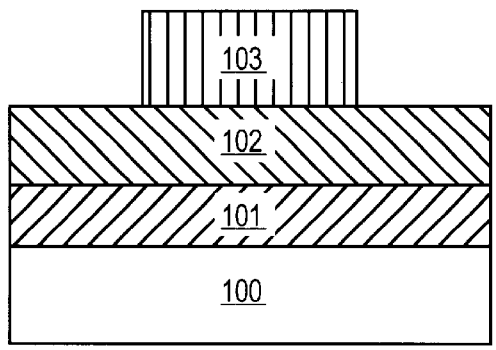
FIGS. 1*a*–1*d* represent cross-sections of structures that may result after certain steps are used to make a semiconductor device, following one embodiment of the method of the present invention.
Figure 1B:
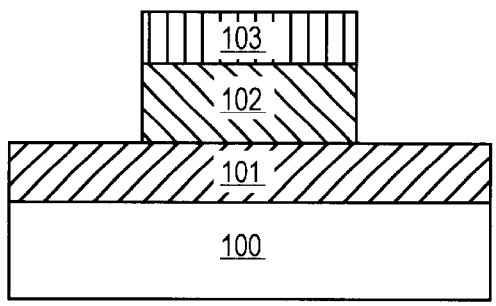
Figure 1C:
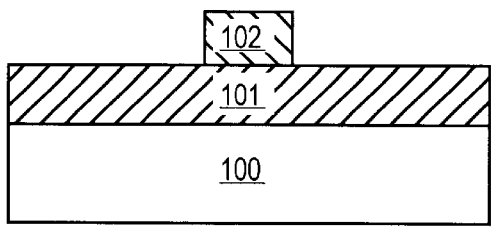
Figure 1D:
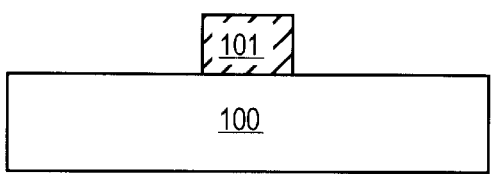

A method of forming a semiconductor device is described. That method comprises the following steps. First, a masking layer is formed on a substrate. A layer of photoresist is then deposited and patterned on the masking layer to expose a first part of the masking layer while covering a second part of the masking layer. After etching the exposed first part of the masking layer, the resulting device is exposed to a plasma generated from a forming gas. Part of the second part of the masking layer is then removed by exposing the resulting device to a solution, while part of the second part of the masking layer is retained.

FIGS. 1*a*–1*d* illustrate one embodiment of the method of the present invention. In that embodiment, layer 101 is formed on substrate 100. Substrate 100 may be a silicon wafer upon which various conductive and insulated regions have been formed. In some embodiments of the present invention, substrate 100 may further include certain types of active and passive devices, a number of conductive layers and a number of insulating layers that separate those conductive layers.

Layer 101 comprises a layer that will be subsequently processed. Layer 101 may comprise a layer to be etched (e.g., a conductive layer that will be etched to generate conductive lines). Alternatively, layer 101 may comprise a layer that will be implanted with conductivity modifying impurities. In a preferred embodiment, layer 101 comprises polysilicon, e.g., a polysilicon containing layer that will be etched to define the gate electrodes for the device's transistors.

After forming layer 101 on substrate 100, masking layer 102 is formed on layer 101. (When the combination of layer 101 and substrate 100 is considered as the "substrate," masking layer 102 is formed on that "substrate." In some embodiments, masking layer 102 may be formed directly on a silicon wafer, or other foundation for making a semiconductor device—such as to enable masking certain portions of the wafer from the effects of certain process steps, e.g., ion implantation or other types of doping processes.)

As described below, masking layer 102 comprises a material that may be etched then shrunk when exposed to certain types of solutions. In a preferred embodiment, both the width and thickness of that material (after it is etched) may be simultaneously reduced when exposed to such a solution. In a particularly preferred embodiment, the width of that material may be reduced, while ensuring that its aspect ratio (i.e., the ratio of its height or thickness to its width) does not increase substantially. That attribute ensures that the resulting structure will not become top heavy as its width is decreased, which could cause it to topple over.

Preferably, masking layer 102 comprises a spin-on-glass ("SOG")—more preferably a dyed SOG, e.g., a SOG that contains a light absorbing dye that can absorb light at DUV wavelengths (e.g., wavelengths of 157, 193 or 248 nm) or even smaller wavelengths. Suitable dyed SOG materials may be obtained from Honeywell, Inc., or Tokyo Ohka Kogyo Co., Ltd. Such a dyed SOG may be deposited by spin coating the material onto the surface of layer 101. Although a dyed SOG is a particularly preferred material for forming masking layer 102, other materials that may shrink when exposed to a solution, as described below, may be used to form masking layer 102. When originally formed on layer 101, masking layer 102 should have a thickness that ensures that it can still perform its masking function after its size is reduced by subsequent processing.

After forming masking layer 102, a photoresist layer 103 is patterned on top of it to expose a first part of layer 102 while covering a second part of layer 102. Photoresist layer 103 may be patterned using typical photolithographic techniques, such as masking the layer of photoresist, exposing the masked layer to light, then developing the unexposed portions. The resulting structure is shown in FIG. 1*a*.

After photoresist layer 103 is patterned, masking layer 102 is etched down to layer 101. When layer 102 comprises a SOG, conventional process steps for etching a SOG layer may be used. The etch process may be a timed etch, which ensures that the etch process stops when reaching layer 101. Alternatively, layer 101 may act as an etch stop for the SOG etch process, as will be apparent to those skilled in the art. The SOG etch step (or steps) generates a structure like the one illustrated in FIG. 1*b*. (Note that the SOG etch process may serve to reduce the thickness of photoresist layer 103.)

Although in this embodiment of the method of the present invention layer 101 is not etched when masking layer 102 is etched, in alternative embodiments, all or part of the portion of layer 101 that lies beneath the exposed part of layer 102 may be etched at the same time the exposed portions of layer 102 are etched.

After masking layer 102 is etched, a forming gas ash may be applied to remove the photoresist. The forming gas preferably comprises a plasma that contains hydrogen. Such a plasma may be generated in the chamber that contains the wafer that photoresist 103 covers. Alternatively, the plasma may be struck in another chamber, then subsequently transported into the chamber that contains the wafer. Either way, such a hydrogen containing plasma may comprise hydrogen combined with any of the following gases: nitrogen, helium, argon, xenon, neon, or krypton. Preferably, such a forming gas includes at least about 2% hydrogen. In a particularly preferred embodiment, such a forming gas includes about 4% hydrogen in nitrogen.

The equipment and operating conditions for using a forming gas to remove photoresist layer 103 may be those typically used in this type of plasma ashing process. Such a process may remove the photoresist in either an isotropic or anisotropic fashion, and may be applied over a wide range of temperatures and pressures. Optimal parameters may vary depending upon the type of masking structure (e.g., width, thickness, and material) that is desired.

Following that forming gas ash step, photoresist residues are removed and the portion of masking layer 102, which the photoresist previously covered, is reduced. This may be accomplished by exposing the device to a solution that may wet etch that material such that it simultaneously reduces both its thickness and width. In a preferred embodiment, masking layer 102 is exposed to a dilute HF solution. Such a solution may comprise a blend of deionized water, or ethylene glycol, and HF in a ratio of between about 6:1 and about 500:1. The wafer preferably is dipped into such a dilute HF solution for between about 30 seconds and about 30 minutes—the duration of the dip generally being inversely proportional to the solution's concentration. Exposing the wafer to a 100:1 dilute HF solution for about two minutes should significantly reduce the width of masking layer 102, while still enabling part of that layer to be retained. A more controllable process may result by using a more dilute HF solution while increasing the duration of the dip.

As dip duration increases, a greater portion of masking layer 102 is removed. Consequently, given a particular solution concentration, it is possible to vary the degree to which the masking layer is shrunk by varying dip duration. Preferably, a concentration and dip duration should be selected that reduces the width of masking layer 102, while ensuring that its aspect ratio does not increase substantially. The optimal concentration and dip duration may vary depending upon the type of masking structure (e.g., width, thickness, and material) that is desired. After exposing the device to a dilute HF solution, the structure illustrated in FIG. 1c results.

Applying a hydrogen containing plasma to remove photoresist 103, followed by applying a wet etch process to remove only part of masking layer 102, generates a hard mask that can define a critical dimension ("CD") for underlying layer 101 that is substantially smaller than the CD that patterned photoresist layer 103 would have defined. This process may be controlled to vary the degree to which masking layer 102's width is reduced. It may be only slightly reduced from its original width, or instead reduced to 20% or less of the width of patterned photoresist layer 103. In this regard, such a process may enable the creation of a hard mask that may define a CD of 100 nanometers or less.

After the wet etch step, layer 101 may be etched using a conventional anisotropic etch process. (If part or all of the portion of layer 101—that was located beneath the part of layer 102 that was exposed during the photoresist patterning step—had been removed earlier, this subsequent etch step will remove any remaining portions of layer 101 that are not covered by the shrunken masking layer 102.) The rest of layer 102 may then be removed. When layer 101 is a polysilicon containing layer, the remaining etched structure, illustrated in FIG. 1d, may define the gate electrode for a transistor.

Figure 2A:
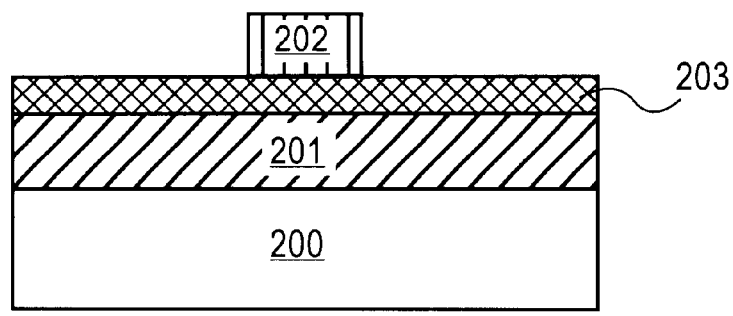
FIGS. 2*a*–2*c* represent cross-sections of structures that may result after certain steps are used to make a semiconductor device, following a second embodiment of the method of the present invention.
Figure 2B:
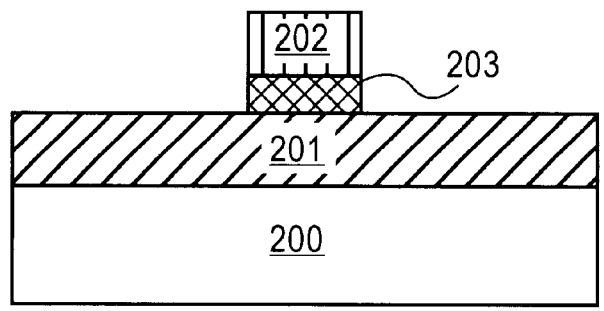
Figure 2C:
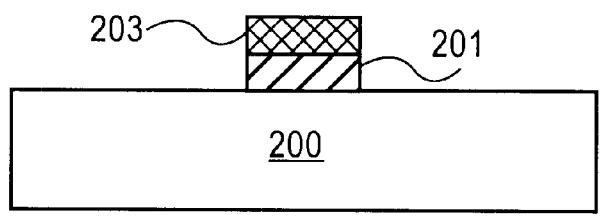

In the above described embodiment, masking layer 102 is formed directly upon the layer, or structure, that will be processed, e.g., etched, implanted with ions, or otherwise modified. When the process used to etch layer 102 is not highly selective for that layer over layer 101, it may be advantageous to form an intermediate masking layer between masking layer 102 and layer 101. In such an alternative embodiment, as illustrated in FIGS. 2a–2c, an intermediate masking layer 203 may be formed on layer 201, with masking layer 202 then formed on that intermediate layer. In such an alternative embodiment, masking layer 202 may be processed, as described above, to define a masking member with a very small width. That masking member may then serve as a mask 202, which covers part of intermediate masking layer 203, while leaving other parts of that layer exposed—as shown in FIG. 2a.

Intermediate masking layer 203 may then be etched to generate a hard mask that covers part of layer 201, while leaving other parts of that layer exposed—as shown in FIG. 2b. Layer 202 may then be removed, and layer 201 etched with layer 203 performing the masking function for that etch step, to generate the structure shown in FIG. 2c. Masking layer 203 can then be removed. When masking layer 202 comprises SOG, intermediate masking layer 203 may comprise silicon nitride or silicon oxynitride. When masking layer 202 comprises another type of material, other materials may be used to form intermediate masking layer 203, e.g., silicon carbide, silicon oxycarbide, or silicon dioxide.

The improved method for making a semiconductor device of the present invention enables the creation of a masking layer that can define a CD of 100 nanometers or less. Although the foregoing description has specified certain steps, materials, and equipment that may be used in such a method for making a semiconductor device, those skilled in the art will appreciate that many modifications and substitutions may be made. For example, although the embodiments illustrated above specify using a dilute HF solution to shrink the masking layer, the method of the present invention contemplates the use of other solutions that may perform that function. Although the masking layer is preferably made from a dyed SOG, it may be made from other materials that shrink when exposed to certain types of solutions. Although the above described method may be applied to reduce the CD for a transistor gate electrode, it may also be used to reduce the CD for other components or features, or be applied to form masking structures that are used for reasons other than CD definition. Accordingly, it is intended that all modifications, alterations, substitutions and additions to the above described embodiments be considered to fall within the spirit and scope of the invention as defined by the appended claims.

What is claimed is:

1. A method of forming a semiconductor device comprising:

forming a masking layer on a substrate;
   depositing then patterning a layer of photoresist on the masking layer to expose a first part of the masking layer while covering a second part of the masking layer;

etching the exposed first part of the masking layer;

exposing the resulting device to a plasma generated from a forming gas; and then removing part of the second part of the masking layer by exposing the resulting device to a solution, while part of the second part of the masking layer is retained, wherein the masking layer comprises a dyed spin-on-glass.

2. A method of forming a semiconductor device comprising:

forming a polysilicon containing layer on a substrate;

forming a dyed spin-on-glass containing layer on the polysilicon containing layer;

depositing then patterning a layer of photoresist on the dyed spin-on-glass containing layer to expose a first part of the dyed spin-on-glass containing layer while covering a second part of the dyed spin-on-glass containing layer;

etching the exposed first part of the dyed spin-on-glass containing layer;

exposing the remaining photoresist to a plasma generated from a forming gas;

exposing the second part of the dyed spin-on-glass containing layer to a hydrogen fluoride containing solution that comprises hydrogen fluoride in either ethylene glycol or deionized water; and then etching the polysilicon containing layer to define a gate electrode structure for a transistor.

3. The method of claim 2 wherein the forming gas comprises a mixture of hydrogen and a gas selected from the group consisting of nitrogen, helium, argon, krypton, neon, and xenon.

4. The method of claim 2 wherein exposing the second part of the dyed spin-on-glass containing layer to the hydrogen fluoride containing solution reduces both the width and thickness of the second part of the dyed spin-on-glass containing layer.

5. The method of claim 4 wherein the second part of the dyed spin-on-glass containing layer is reduced until its width is less than about 100 nanometers.

6. The method of claim 5 wherein the width of the second part of the spin-on-glass containing layer is reduced while ensuring that the aspect ratio for the second part of the spin-on-glass containing layer does not increase substantially.

7. The method of claim 6 wherein etching the polysilicon containing layer to define a gate electrode structure for a transistor defines a gate electrode structure that has a critical dimension of less than about 100 nanometers.

8. The method of claim 7 wherein the hydrogen fluoride containing solution comprises ethylene glycol and hydrogen fluoride in a ratio of between about 6:1 and about 500:1 or deionized water and hydrogen fluoride in a ratio of between about 6:1 and about 500:1.

9. A method of defining the critical dimension for a gate electrode for a transistor comprising:

forming a polysilicon containing layer on a substrate;

forming a dyed spin-on-glass containing layer on the polysilicon containing layer;

depositing then patterning a layer of photoresist on the dyed spin-on-glass containing layer to expose a first part of the dyed spin-on-glass containing layer while covering a second part of the dyed spin-on-glass containing layer;

etching the exposed first part of the dyed spin-on-glass containing layer;

exposing the remaining photoresist to a plasma generated from a forming gas;

exposing the second part of the dyed spin-on-glass containing layer to a hydrogen fluoride containing solution that comprises hydrogen fluoride in either ethylene glycol or deionized water; and then etching the polysilicon containing layer to remove those portions of the polysilicon containing layer that are not covered by the second part of the dyed spin-on-glass containing layer that remains following its exposure to the hydrogen fluoride containing solution.

10. The method of claim 9 wherein the forming gas comprises a mixture of hydrogen and a gas selected from the group consisting of nitrogen, helium, argon, krypton, neon, and xenon.

11. The method of claim 10 wherein the second part of the dyed spin-on-glass containing layer is reduced until its width is less than about 100 nanometers.

12. The method of claim 11 wherein the width of the second part of the dyed spin-on-glass containing layer is reduced while ensuring that the aspect ratio for the second part of the dyed spin-on-glass containing layer does not increase substantially.

13. The method of claim 12 wherein etching the polysilicon containing layer defines a gate electrode structure for a transistor that has a critical dimension of less than about 100 nanometers.

14. The method of claim 9 wherein exposing the second part of the dyed spin-on-glass containing layer to the hydrogen fluoride containing solution reduces both the width and thickness of the second part of the dyed spin-on-glass containing layer.

* * * * *